United States Patent [19]
Kawase et al.

[11] 3,941,985
[45] Mar. 2, 1976

[54] APPARATUS FOR CARRYING OUT BONDING AT PROGRAMMED POSITIONS OF A CIRCUIT ELEMENT AND AT CORRECTED POSITIONS OF LEADS THEREFOR

[75] Inventors: Katsuyuki Kawase; Mutumi Sato; Kuniaki Hamada; Seiji Hayashi, all of Tokyo, Japan

[73] Assignees: Nippon Electric Company Limited; Kaiji Denki Kabushiki Kaisha, both of Tokyo, Japan

[22] Filed: Oct. 23, 1974

[21] Appl. No.: 517,307

[30] Foreign Application Priority Data
Oct. 25, 1973 Japan.............................. 48-120112
July 30, 1974 Japan.............................. 49-87764

[52] U.S. Cl............................. 235/151.1; 198/237
[51] Int. Cl.² ........................................ G06F 15/46
[58] Field of Search.............. 235/151.1; 219/121 L; 178/6.8

[56] References Cited
UNITED STATES PATENTS
3,603,771   7/1969   Isett et al............................ 235/151
3,764,775   10/1973  Hasslinger et al............ 235/151.11

*Primary Examiner*—Eugene G. Botz
*Attorney, Agent, or Firm*—Hopgood, Calimafde, Kalil, Blaustein & Lieberman

[57] ABSTRACT

In an automatic wire bonder, a rotatable work stage for a lead frame on which a plurality of leads are arranged and an electronic circuit element having a plurality of electrodes is mounted for rotation to align the circuit element in a predetermined direction. The angle of rotation is detected as an azimuthal error. A bonding tool is subsequently translated relative to the work stage to a position predetermined relative to the circuit element. The translation is detected as a positional error. Calculating means electrically calculates the relative positions of the leads using absolute positions of the leads and the azimuthal and positional errors. The bonding tool is driven responsive to the absolute positions of the electrodes and the relative positions of the leads to carry out the bonding process.

6 Claims, 5 Drawing Figures

APPARATUS FOR CARRYING OUT BONDING AT PROGRAMMED POSITIONS OF A CIRCUIT ELEMENT AND AT CORRECTED POSITIONS OF LEADS THEREFOR

BACKGROUND OF THE INVENTION:

This invention relates to a wire bonder, namely, apparatus for electrically connecting by a plurality of fine electrically conductive wires or bonds a plurality of electrodes of an electronic circuit element and a plurality of leads arranged in a predetermined geometric configuration on a lead frame. The circuit element may be a pellet or chip of a semiconductor integrated circuit. The fine wires may be of gold, aluminium, or a similar material. This invention will therefore be described mainly as applied to the bonding of semiconductor pellet electrodes and leads therefor.

In the manufacture of integrated circuits, bonding requires about a half of the man hours and has therefore created a production bottleneck. Automatic wire bonders of two major types have recently been proposed.

A bonder of a first previously proposed type comprises a work stage for supporting a lead frame on which a pellet is mounted in a preselected position, a bonding tool movable relative to the work stage for carrying out the bonding operation itself, feedback means for producing signals representative of the present position of the bonding tool relative to the work stage, and a control computer system comprising, in turn, a program storage for a banding program, a position or coordinate storage for positions or coordinates for the electrodes and leads, and a central processing unit for driving the bonding tool between the programmed positions of the electrodes and leads to sequentially carry out the bonding in compliance with the program. The bonder operates on the assumption that the pellet is mounted on each lead frame in an ideal or prescheduled position with the ideal prescheduled orientation. It is therefore necessary that the mounting of a pellet on a lead frame be done with great care and that the leads have wide ends to provide a tolerance for possible misalignment of a pellet on the lead frame. The latter fact makes it impossible to apply the bonder to bonding of electrodes of a large-scale integrated circuit with closely spaced leads.

A bonder of a second previously proposed type comprises, in addition to the elements of the bonder described in the preceding paragraph, adjusting means for turning the work stage, which is now rotatable, and displacing the bonding tool relative to the work stage to cause the feedback means to produce electric signals representative of the amount of misalignment in the directions of an orthogonal rectilinear coordinate axes and in the azimuthal direction on starting the bonding. More particularly, the work stage is rotated from a position in which the lead frame is aligned with the coordinate axes to a position in which the pellet is so aligned. In addition, the bonding tool is displaced to a starting position predetermined with respect to the pellet. On carrying out the bonding at each lead, the control computer system rotates the work stage in compliance with the azimuthal error and drives the bonding tool to a position determined by the programmed position and the axial misalignment. Although the bonding is thus automatically carried out, it is necessary to rock the work stage on carrying out bonding at each of the electrodes and leads. Due to the rocking motion of the work stage of a large mass, the bonder generates considerable vibrations and must operate at a low speed. In addition, the bonder is unreliable particularly in the azimuthal direction.

Furthermore, it has been necessary with conventional automatic bonders to carry out troublesome adjustment of zero points of the feedback means upon each change of the pellets from one type to another. Such bonders also require a change from one to another of the position storages for the pellets of the respective types.

SUMMARY OF THE INVENTION

It is therefore an object of the present invention to provide a wire bonder operable with the least possible motion of mechanical elements thereof.

It is another object of this invention to provide a wire bonder operable at high speed and yet with high reliability.

It is still another object of this invention to provide a wire bonder for bonding electrodes of an electronic circuit element and leads therefor, operable without troublesome adjustment, of a zero point of means for detecting the present location of a bonding tool, even upon a change in the circuit elements from one type to another.

It is yet another object of this invention to provide a wire bonder applicable to bonding of electrodes of large-scale integrated circuits and leads therefor.

As described hereinabove, automatic apparatus for electrically connecting by a plurality of electrically conductive wires a plurality of electrodes of an electronic circuit element and a plurality of leads arranged in a predetermined geometric configuration on a lead frame includes a rotatable work stage on which the lead frame is placed with the circuit element mounted on the lead frame. The apparatus further includes a bonding tool movable with respect to the work stage, driving means for driving the bonding tool relative to the work stage with reference to positions of the electrodes and leads stored in a position storage means to enable the bonding tool to carry out the bonding process, and azimuthal means for rotating the work stage to align the circuit element in a predetermined direction. During rotation of the work stage, the azimuthal means produces an electric signal representative of an azimuthal error.

In accordance with this invention, the apparatus mentioned in the paragraph above comprises translational means for translating the bonding tool relative to the work stage after the circuit element is aligned in the predetermined direction to place the bonding tool at a predetermined position relative to the circuit element. During translation of the bonding tool, the translational means produces an electric signal representative of a positional error. In addition, the driving means of the apparatus comprises calculating means responsive to the positions of the leads and the azimuthal and positional errors for electrically calculating relative positions of the leads and means responsive to the positions of the electrodes stored in the position storage means and the relative positions of the leads for driving the bonding tool to carry out the bonding process.

It will be understood that the number of electrodes may not be equal to the number of leads and that the position storage program may be removably attached to apparatus rather than formed as an integral part thereof.

BRIEF DESCRIPTION OF THE DRAWINGS:

For a more detailed understanding of the invention, reference may be had to the description below for exemplary embodiments taken in conjunction with the accompanying drawings wherein.

Figure 1:
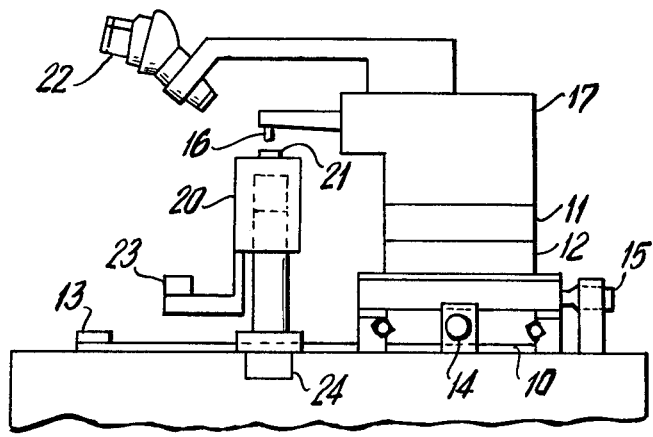
FIG. 1 is a schematic side view of apparatus constructed according to the instant invention.

DESCRIPTION OF THE PREFERRED EMBODIMENTS:

Referring to FIG. 1, a wire bonder according to the present invention comprises an X-Y stage 10, an X driver 11 including a first pulse motor (not shown) for driving the stage 10 parallel to the X axis (right-to-left), a Y driver 12 including a second pulse motor (not shown) for driving the stage 10 parallel to the Y axis (front-to-back), an X-Y manipulator or control knob 13 for manually adjusting the X-Y zero position of the stage 10, and a pair of electronic micrometers 14 and 15 for detecting the X and Y components of displacement of the stage 10, respectively, and for producing a pair of electric signals representative of the respective components. The electronic micrometer 14 or 15 is formed by a differential transformer (not shown) comprising, in turn, a rod-shaped transformer core movable in accordance with the pertinent X or Y component of displacement, a primary winding along the core, and a secondary winding having two portions of opposite polarity extending along the core which are serially connected at the center or zero position With an a.c. voltage supplied across the primary winding, a voltage representative of the pertinent component is developed across the secondary winding. Each electronic micrometer 14 or 15 may also include an analog-to-digital converter for converting the voltage thus developed into a digital electric signal representative of the pertinent component. The bonder still further comprises a bonding tool 16 and a Z driver 17 mounted on the X and Y drivers 11 and 12 and including a Z motor (not shown) for moving the bonding tool 16 approximately parallel to the Z axis (up-and-down). The bonding tool 16 is therefore movable relative to the stage 10 by the X, Y, and Z drivers 11, 12, and 17. The bonder still further comprises a work stage 20 rotatable about a fixed vertical axis extending under the bonding tool 16 in approximately the X-Y zero position for mounting thereon a lead frame 21, a microscope or television pickup tube 22 for viewing a predetermined area of the work stage 20, a rotatable knob 23 for manually adjusting the azimuthal position of the work stage 20, and a rotary encoder 24 comprising, in turn, a rotary transducer (not shown) responsive to an angular displacement of the work stage 20 about its axis for producing an electric signal representative of the angular displacement. By way of example, a rotary transducer of a photoelectric type comprises a coded disk mechanically coupled to the axle of the work stage 20 and having a plurality of slits in the peripheral portion and a single slit for defining the azimuthal zero position of the work stage 20, two light sources for the peripheral slits and the single slit, respectively, and two photoelectric tubes or like elements responsive to the light having passed through the single slit and each of the peripheral slits for producing a zero position electric pulse and electric pulses of a number representative of the angle of rotation of the work stage 20. The work stage 20 may be provided with a feeder (not shown) for automatically putting a plurality of successive lead frames in position on the work stage 20. It will be understood that the bonding tool 16 is driven relative to the work stage 20 through the X, Y, and Z drivers 11, 12, and 17 by means to be described later for making the tool 16 carry out bonding between electrodes of a pellet (not shown in FIG. 1) mounted on a lead frame 21 and leads (not shown in FIG. 1) arranged in a predetermined geometric configuration on the lead frame 21.

Figure 2:
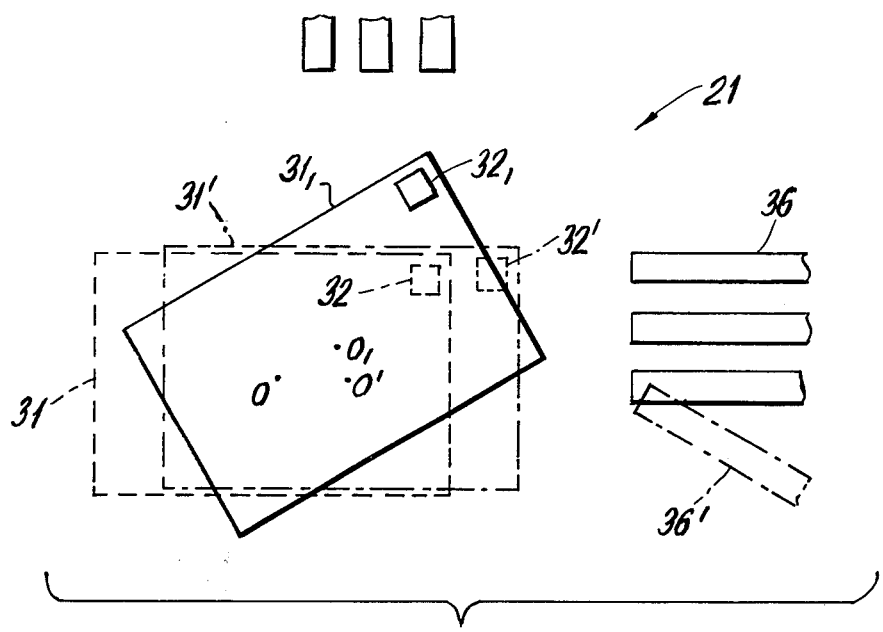
FIG. 2 schematically shows a top view of a lead frame and an electronic circuit element mounted thereon which illustrates the principles of operation of an apparatus constructed according to a first embodiment of this invention.

Referring now to FIG. 2, a pellet 31 should ideally be mounted on a lead frame 21 in a position illustrated by dashed lines with its center placed at an origin 0 of an X-Y coordinate system and with an n-th electrode 32 placed accordingly at a particular point. The origin 0 is on the axis of rotation of the work stage 20. It may be presumed that a pellet $31_1$ is actually mounted on the lead frame 21 as shown by full lines with its center placed at a point $0_1$, its orientation having an azimuthal error $\Delta\theta$, and its n-th electrode $32_1$ placed as shown. When the work stage 20 is turned by the knob 23 so as to correct the azimuthal error or align the actual pellet $31_1$ with the coordinate axes, the actual pellet assumes a position $31'$ depicted by dot-and-dash lines with its center placed at a point $0'$ having a translational or positional error of X and Y components $\Delta x$ and $\Delta y$ and with its $n$-th electrode placed at a point $32'$ whose coordinates $x_n'$ and $y_n'$ are:

$$\left. \begin{array}{l} x_n' = x_n + \Delta x \\ y_n' = y_n + \Delta y, \end{array} \right\}$$

where $x_n$ and $y_n$ are the coordinates stored for the n-th electrode in a position or coordinate storage means. With this rotation, an $n$-th lead 36 to which the $n$-th electrode 32 should be bonded assumes a position $36'$ shown by dot-and-dash lines. The coordinates $x_{Ln}'$ and $y_{Ln}'$ of the n-th lead $36'$ are:

$$\left. \begin{array}{l} x_{Ln}' = R\cos(\theta - \Delta\theta) = x_{Ln}\cos\Delta\theta + y_{Ln}\sin\Delta\theta \\ y_{Ln}' = R\sin(\theta - \Delta\theta) = y_{Ln}\cos\Delta\theta - x_{Ln}\sin\Delta\theta, \end{array} \right\} \quad (1)$$

where $x_{Ln}$ and $y_{Ln}$ are the coordinates stored in the coordinate storage for the $n$-th lead 36 and $R^2 = x_{Ln}^2 + y_{Ln}^2$. When the X-Y stage 10 is adjusted by the X-Y manipulator 13 so as to correct the translational error, the starting point of the bonding tool 16 moves accordingly. This is equivalent to a translation or displacement of the lead frame 21 together with the pellet to bring the center of the actual pellet to the origin 0 of the coordinate system. It follows therefore that the coordinates of the electrodes of the actual pellet coincide with the data given in the coordinate storage and that the relative or corrected coordinates of the leads are now given by subtracting the translational error components from the azimuthally corrected coordinates. For example, the coordinates of the $n$-th electrode are $(x_n, y_n)$ and the relative coordinates $(X_{Ln}, Y_{Ln})$ of the $n$-th lead are:

$$X_{Ln} = x_{Ln}' - \Delta x \\ Y_{Ln} = y_{Ln}' - \Delta y. \qquad (2)$$

The displacements of the bonding tool 16 from a first electrode to a first lead, from the first lead to a second electrode, and so on are $(X_{L1} - x_1, Y_{L1} - y_1)$, $(x_2 - X_{L1}, y_2 - Y_{L1})$, .... According to a first embodiment of this invention, the means mentioned in connection with FIG. 1 drives the bonding tool 16 in compliance with these displacements to carry out the bonding procedure. From the above, it will be understood that the X-Y manipulator 13 may comprise means (not shown) for locking the same until adjustment of the work stage 20 is finished.

It is to be pointed out here that use may be made of approximate equations:

$$x_{Ln}' = x_{Ln} + y_{Ln}\Delta\theta \\ y_{Ln}' = y_{Ln} - x_{Ln}\Delta\theta$$

and $$X_{Ln} = x_{Ln} - x + y_{Ln}\Delta\theta \\ Y_{Ln} = y_{Ln} - y - x_{Ln}\Delta\theta \qquad (3)$$

instead of Formulae (1) and (2), respectively, if the azimuthal error is given in radians. It is therefore possible according to a modification of the first embodiment to drive the bonding tool 16 with reference to the ideal or scheduled coordinates of the electrodes and the relative coordinates of the leads calculated by the Formulae (3).

Figure 3:
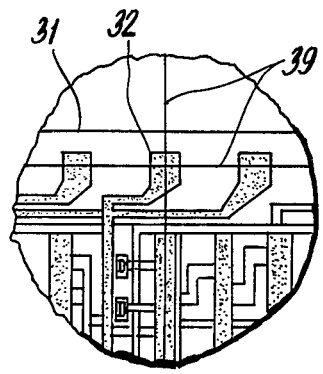
FIG. 3 similarly shows the field of a microscopic view of the apparatus illustrated in FIG. 1.

Referring again to FIG. 1 and further to FIG. 3, an operator looks at a pellet 31 through the microscope 22 or a monitor (not shown) for a pickup tube and adjusts at first the control knob 23 so as to correct the azimuthal error, if any, with reference to one of the cross hairs 39 therein which define the starting point of the bonding tool 16 and the coordinate axes. Thereafter, the operator adjusts the X-Y control knob 13 to bring a predetermined first electrode into registration with the cross-point of the cross hairs 39. Meanwhile, the electronic micrometers and rotary encoder 14, 15, and 24 produce electric signals representative of the translational error components $\Delta x$ and $\Delta y$ and the azimuthal error $\Delta\theta$. The operator now pushes a start button (not shown) of the bonder to start the automatic bonding. During the progress of automatic bonding, the operator may carry out adjustment of several other bonders for similarly carrying out bonding process.

Figure 4:
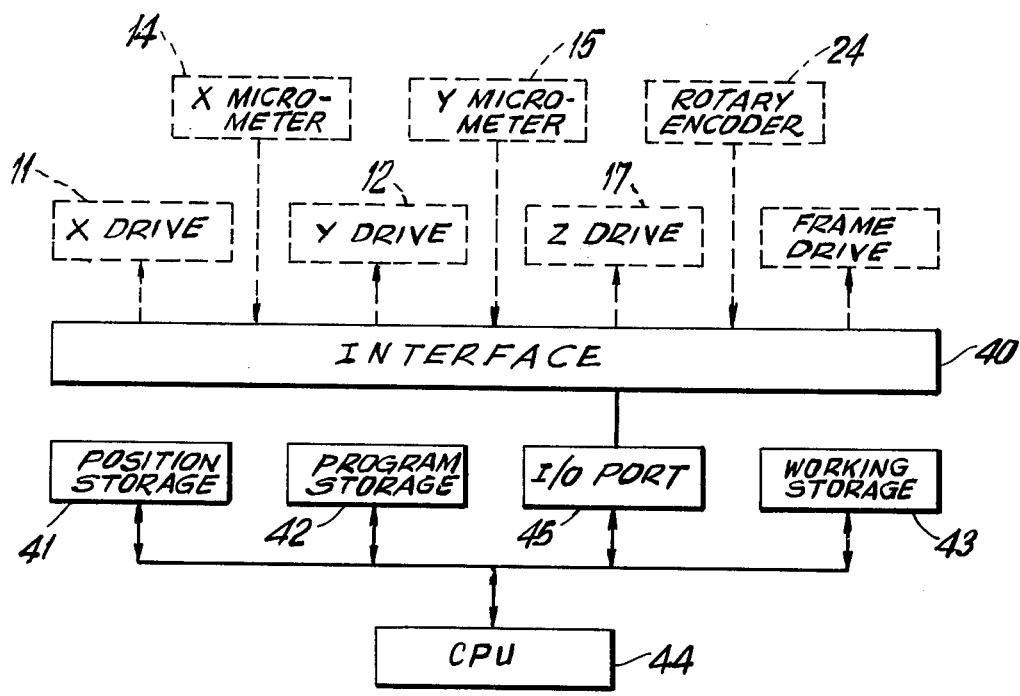
FIG. 4 is a block diagram of the calculating means of the apparatus depicted in FIG. 1.

Referring to FIG. 4, the means metioned above comprises a control computer system, such as described by Emanuel S. Savas at pages 239–261 of "Computer Control of Industrial Processes" published 1965 by McGraw-Hill Book Company, and an interface 40 for the computer system for sending signals from the computer system to the X, Y, and Z motors depicted in FIG. 4 at 11, 12, and 17 and for feeding signals representative of the present position or location of the bonding tool 16 back to the computer system from the electronic micrometers and rotary encoder 14, 15, and 24. In the example illustrated here, the computer system comprises a coordinate or position memory or storage 41 for the coordinates or positions of every pair of leads and the electrodes of a pellet disposed in an ideal or scheduled position relative to the leads, a program storage 42 for a program which will be described below, an additional or working storage 43, and an arithmetic or central processing unit 44 responsive to the program for storing the errors $\Delta x$, $\Delta y$, and $\Delta\theta$ in the working storage 43 through an input-output port 45, successively calculating Formulae (2) or (3) by the use of the errors and the nominal coordinates of the leads stored in the coordinate storage 41 to store the resulting relative coordinates of the leads in the working storage 43, and successively supplying through the port 45 signals for driving the bonding tool 16 between the electrodes defined by the nominal coordinates and the corresponding leads specified by the relative coordinates. While the bonding tool 16 is placed at each of the electrodes and leads, the central processing unit 44 produces a busy signal to bring the tool 16 to a standstill relative to the X, Y, and Z coordinates and to cause the tool 16 to carry out the bonding process. After all programmed bonding is finished, the central processing unit 44 may send a signal to the lead frame feeder to automatically place the next lead frame in position on the work stage 20. Forty lead frames may thus be automatically dealt with successively. The central processing unit 44, the working storage 43, the program storage 42, the coordinate storage 41, and the input-output port 45 may, for example, comprise large-scale integrated circuits, which may be a single $\mu$PD 751 D, a single $\mu$PD 412 D, three $\mu$PD 463 D, a single V 5943, and five $\mu$PD 752 D, respectively, all manufactured and sold by Nippon Electric Company, Tokyo, Japan. The values of $\cos\Delta\theta$ and $\sin\Delta\theta$ or $\Delta\theta$ for various values of the azimuthal error ranging, for example, from $-5°$ to $+5°$ may be stored in a read-only memory having graduations of perhaps 0.5°. The coordinate storage 41 may also be a read-only memory for each type of pellet and may be substituted for another when pellets of a different type are to be dealt with. Alternatively, a plurality of coordinate storages for various types of pellets may be included in the bonder and interchanged in accordance with a change in the pellet type. The program may be universal to various pellet types. If desired, a pause button (not shown) of the bonder may be pushed to interrupt the progress of bonding when the bonding tool 16 comes onto a next succeeding electrode to allow visual inspection of the result of bonding through the microscope 22 or on the monitor. Bonding may be continued by pushing the start button again. Alternatively, the bonding tool 16 may be returned to the starting position by pushing a reset button (not shown) to make the bonder ready of bonding for another lead frame and pellet. Incidentally, the speed of bonding may be 0.5 second per wire (two points of connection at the electrode and lead).

Figure 5:
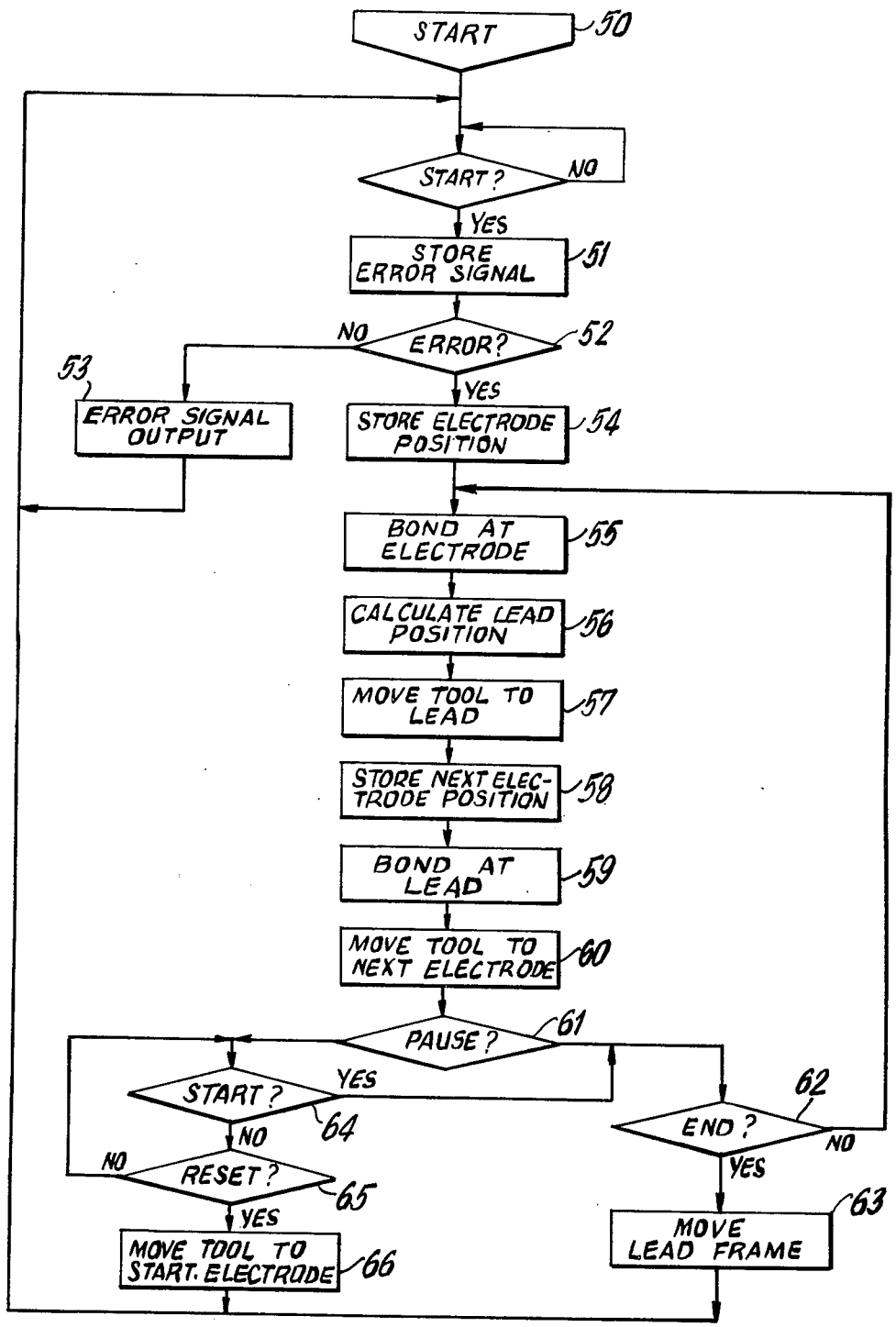
FIG. 5 is a flow chart of the operation of the apparatus shown in FIG. 1.

Referring to FIG. 5, the process including the automatic operation carried out in compliance with a program after completion of manual adjustment of the work stage 20 and the X-Y stage 10 to align a pellet with the coordinate axes and subsequently bring the first electrode of the pellet into position is as follows. As described, the operator manually pushes the start button at block 50. The central processing unit 44 stores at block 51 the error signals in the working storage 43, checks at block 52 to determine whether the errors are within certain predetermined limits, produces at block 53 an error signal if the errors are outside of the ranges and indicate the necessity of remounting the pellet on the lead frame, and transfers if affirmative the coordinates of the first electrode from the coordinate storage 41 to the working storage 43 at block 54. The range for the azimuthal error may be from $-5°$ to $+5°$ as already described. The range for each translational error component may be from $-0.5$ mm to $+0.5$ mm. In this example, the central processing unit 44 then produces at block 55 a signal for carrying out the bonding at the first electrode already placed at a point specified by its coordanates, calculates in the meantime at 56 the relative coordinates for the first lead and the displacement to be given to the bonding tool 16 to bring the tool 16 from the first electrode to the first lead, produces at block 57 a signal for imparting the calculated displacement to the bonding tool 16, transfers at block 58 the coordinates of the next subsequent electrode from the coordinate storage 41 to the working storage 43, produces at block 59 a signal for carrying out the bonding at the first lead, meanwhile calculates the displacement of the bonding tool 16 necessary to move the same from the first lead to the next electrode, and produces at block 60 a signal for imparting the latter calculated displacement to the bonding tool 16. The central processing unit 44 checks at block 61 to determine whether the pause button has been pushed to provide a pause signal. If not, the central processing unit 44 checks at block 62 with reference to the coordinates of the last-mentioned electrode whether or not bonding for the pellet has been finished. If not, the central processing unit 44 again produces at block 55 a signal for carrying out bonding at the abovementioned next subsequent electrode and repeats the processes until the bonding operation is eventually finished, when the central processing unit 44 produces at block 63 a signal for activating the automatic lead frame feeder. If the central processing unit 44 detects at block 61 a pause signal, the central processing unit 44 suspends the drive for the X, Y, and Z drivers 11, 12, and 17 and repeatedly checks at block 64 and 65 to determine whether or not a next signal is eventually supplied manually to the control computer system by the start or reset button. When a start signal is supplied again, the central processing unit 44 detects the signal at block 64 and carries out the finish check at block 62 and thereafter the remaining program. When the central processing unit 44 detects a reset signal at block 65, the central processing unit 44 produces at block 66 a signal for moving the bonding tool 16 back to the starting position as described.

In connection with a wire bonder according to the first embodiment of this invention or to the modification thereof, it is to be noted that an electronic micrometer or sensor, such as 14 or 15, is capable of producing a linear output signal within a narrow range of 2 to 3 mm. On the other hand, a pellet of a large-scale integrated circuit is, for example, 4.90 mm by 4.76 mm wide. In general, the zero points of the electronic micrometers 14 and 15 are brought into coincidence with the center of the pellet ideally mounted on the lead frame. On operating a bonder according to the first embodiment or the modification thereof, the zero points may conveniently be brought into coincidence with the starting or first electrode of a pellet of of a standard type to which the bonder is most frequently applied. The convenience, however, results in inaccurate bonding on the side of the leads on applying the bonder to a pellet of a different type and a lead frame of the same type as is often the case in the manufacture of integrated circuits. It is therefore necessary in such a case to carry out troublesome readjustment of the zero points of the electronic micrometers 14 and 15.

Figure 6:
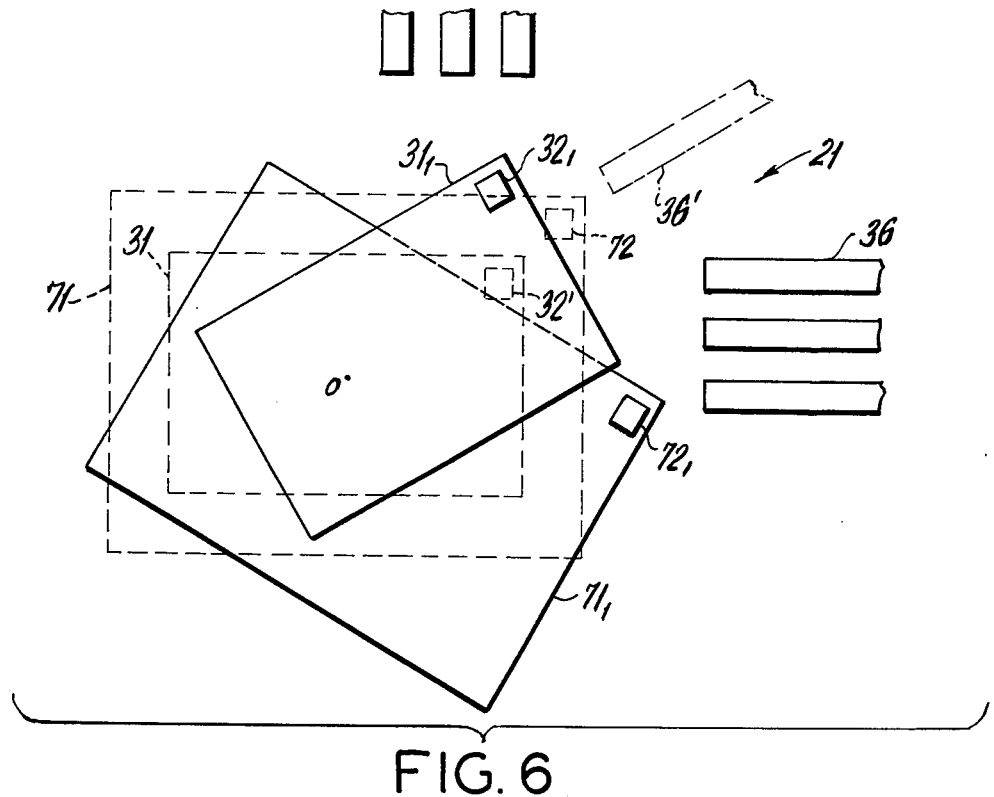
FIG. 6 schematically shows a top view of a lead frame and electronic circuit elements mounted thereon for describing the principles of operation of apparatus according to a second embodiment.

Referring to FIG. 6, a first pellet 31 illustrated with reference also to FIG. 2 may be a pellet of a standard type to which a wire bonder according to this invention is applied most frequently. The first pellet 31 has an n-th electrode 32 to be bonded to an n-th lead 36. The errors for an actual first pellet $31_1$ are now denoted by $\Delta\theta_1$, $\Delta x_1$, and $\Delta y_1$. A second pellet 71 of a different type should ideally be mounted in a position depicted by dashed lines on another lead frame 21 illustrated for convenience of description in superposition on the lead frame on which the first pellet 31 or $31_1$ is mounted. The second pellet 71 has an n-th electrode 72. It is presumed that an actual second pellet $71_1$ having an n-th electrode $72_1$ is mounted on the lead frame 21 in a position shown by full lines and that the errors illustrated with reference to FIG. 2 are $\Delta\theta_2$, $\Delta x_2$, and $\Delta y_2$. It is furthermore assumed that the zero points of the electronic micrometers 14 and 15 have been brought into coincidence with the starting or first electrode (not shown) of the first pellet 31 disposed in the ideal position. According to Formulae (2), the relative coordinates of the n-th lead are:

$$\left. \begin{array}{l} X_{L1.n} = x_{L1.n}\cos\Delta\theta_1 - \Delta x_1 + y_{L1.n}\sin\Delta\theta_1 \\ Y_{L1.n} = y_{L1.n}\cos\Delta\theta_1 - \Delta y_1 - x_{L1.n}\sin\Delta\theta_1 \end{array} \right\}$$

for the first pellet, where $x_{L1.n}$ and $y_{L1.n}$ represent the ideal coordinates of the n-th lead stored in the coordinate storage for the first pellets. Likewise, the relative coordinates of the $n$-th lead are:

$$\left. \begin{array}{l} X_{L2.n} = x_{L1.n}\cos\Delta\theta_2 - \Delta x_2 + y_{L1.n}\sin\Delta\theta_2 \\ Y_{L2.n} = y_{L1.n}\cos\Delta\theta_2 - \Delta y_2 - x_{L1.n}\sin\Delta\theta_2 \end{array} \right\} \quad (4)$$

for the second pellet. In connection with Formulae (4), it should be pointed out that use is now made of leads of the same geometric configuration. If the lead to which the $n$-th electrode of the second pellet is to be bonded is not the $n$-th lead but an $n'$-th lead, ideal coordinates $(x_{L1.n}', y_{L1.n}')$ of the $n'$-th lead for the first pellets should be substituted for the ideal coordinates $(x_{L1.n}, y_{L1.n})$ used in Formulae (4).

Further referring to FIG. 6, the output signals produced by the electronic micrometers 14 and 15 when the bonding tool 16 is placed on the first electrode of a first pellet 31' illustrated with reference to FIG. 2, are representative of the positional error components $\Delta x_1$ and $\Delta y_1$. It is now assumed that the bonding tool 16 is subjected to a displacement from a point where the first electrode of an actual first pellet 31' was located to a point where the first electrode of a second pellet placed in an azimuthally and translationally corrected position is located. If the zero points are not readjusted to the latter point, the output signals of the electronic micrometers 14 and 15 are greater than the output signals produced with the zero points adjusted to the latter point, by a shift or displacement the X and Y components of which are:

$$\left. \begin{array}{l} \bar{x} = x_{2.1} - x_{1.1} \\ \bar{y} = y_{2.1} - y_{1.1} \end{array} \right\}$$

where $(x_{1.1}, y_{1.1})$ and $(x_{2.1}, y_{2.1})$ represent the ideal coordinates of the first electrodes of the first and second pellets, respectively. The bonding at the leads for the second pellets therefore shifts by this amount. A wire bonder according to a second embodiment of this invention obviates the necessity for troublesome readjustment of the zero points and yet carries out accurate bonding at the leads for various types of pellets despite the presence of a shift. For use in combination with a bonder according to the second embodiment, the amount of shift may be stored in a displacement storage (not shown), which may be a portion of the coordinate storage for the pellets of a different type. The bonder carries out bonding at the electrodes by the use of the ideal coordinates and at the leads by calculating in compliance with Formulae (2) or (3) the resulting coordinates, which may now be called calculated coordinates, and by subtracting from the calculated coordinates the amount of shift read from the displacement storage to derive the relative coordinates. For confirmation, the last-mentioned relative coordinates are:

$$\left. \begin{array}{l} X_{L2.n}' = X_{L1.n} - \bar{x} \\ Y_{L2.n}' = Y_{L1.n} - \bar{y}. \end{array} \right\}$$

Although two exemplary embodiments of this invention have been described above, it will now be clear to those skilled in the art that various modifications thereof are possible without departing from the spirit and scope of this invention. For example, the central processing unit 44 may be a table electronic calculator or an electronic computer of any type. Accordingly the above description should not be considered in any sense limiting the scope of the invention. Accordingly the above description should not be considered in any sense limiting the scope of the invention.

What is claimed is:

1. Apparatus for electrically connecting a plurality of electrodes of an electronic circuit element and a plurality of leads arranged in a predetermined geometric configuration on a lead frame, including a rotatable work stage on which the lead frame is placed with the circuit element mounted on the lead frame, a bonding tool movable with respect to said work state, driving means for driving said bonding tool relative to said work stage with reference to positions of the electrodes and leads, and azimuthal means for rotating said work stage to align the circuit element in a predetermined direction, said azimuthal means thereby producing an electric signal representative of an azimuthal error, wherein the improvement comprises:

translational means for translating the bonding tool relative to said work stage after the circuit element is aligned in the predetermined direction to place said bonding tool at a predetermined position relative to the circuit element, the translational means thereby producing an electric signal representative of a positional error; and the driving means including calculating means responsive to the positions of the leads and the azimuthal and positional errors for electrically calculating relative positions of the leads, and means responsive to the positions of the electrodes and the relative positions of the leads for driving the bonding tool to carry out the bonding process, said calculating means comprising first means for converting said azimuthal error into components in the directions of orthogonal rectilinear coordinate axes and second means responsive to the calculating means components, the positions of the leads, and the positional error for electrially calculating the relative positions.

2. The apparatus of claim 1, wherein the first means converts the azimuthal error into components in complicance with $\cos\Delta\theta$, where $\Delta\theta$ represents the azimuthal error.

3. The apparatus of claim 1, wherein the first means converts the azimuthal error into components in compliance with the azimuthal error in radians.

4. The apparatus of claim 1, further comprising displacement storage means for recording the displacement of a predetermined electrode of a first electronic circuit element from a first predetermined to a second predetermined point for a predetermined electrode of a second electronic circuit element of a different type, first position storage means for storing the positions of the electrodes of the second circuit element and leads, wherein said calculating means further comprises means responsive to the positions of the leads and the azimuthal and positional errors produced by said azimuthal and translational means for the second circuit element for electrically calculating positions of the leads and means responsive to said calculated positions and said displacement for electrically calculating the relative positions of the leads for use in carrying out the bonding for the second circuit element.

5. The apparatus of claim 1, further comprising an additional position storage means for recording the position of the electrodes of an additional electronic circuit element different from the aforementioned electronic circuit element, displacement storage means for recording the displacement for a predetermined electrode position recorded in the first mentioned position storage means to a predetermined electrode position recorded in the additional position storage means, the calculating means being responsive to the displacement storage means for calculating the relative positions of leads to be used in bonding the additional electronic circuit element.

6. The apparatus of claim 1, further comprising position storage means for recording the positions of the leads, said driving means being responsive to said position storage means to drive said bonding tool with reference to the stored positions.

* * * * *

UNITED STATES PATENT OFFICE
CERTIFICATE OF CORRECTION

Patent No. 3,941,985　　　　　　　　Dated March 2, 1976

Inventor(s) KAWASE, K., SATO, M. HAMADA, K. and HAYASHI, S.

It is certified that error appears in the above-identified patent and that said Letters Patent are hereby corrected as shown below:

In the caption, change "Nippon Electric Company, Limited; Kaiji Denki Kabushiki Kaisha"

to -- Nippon Electric Company, Limited; Kaijo Denki Kabushiki Kaisha --

Signed and Sealed this

Twenty-seventh Day of July 1976

[SEAL]

Attest:

RUTH C. MASON
*Attesting Officer*

C. MARSHALL DANN
*Commissioner of Patents and Trademarks*